United States Patent [19]

Elabd

[11] Patent Number: 4,539,596
[45] Date of Patent: Sep. 3, 1985

[54] CCD IMAGERS WITH INTERLEAVED IMAGE REGISTERS USING OPPOSED DIRECTIONS OF CHARGE TRANSFER

[75] Inventor: Hammam Elabd, East Windsor, N.J.

[73] Assignee: RCA Corporation, Princeton, N.J.

[21] Appl. No.: 659,459

[22] Filed: Oct. 10, 1984

[51] Int. Cl.$^3$ ............................................. H04N 3/14
[52] U.S. Cl. ..................................... 358/213; 357/24; 250/578
[58] Field of Search .................. 358/213, 41, 44, 209; 357/24 LR, 30, 31; 250/578; 365/45; 377/60, 61, 62, 63

[56] References Cited

U.S. PATENT DOCUMENTS 3,777,061 12/1973 Takemura ............................ 358/44
3,986,176 10/1976 Weimer ................................ 377/62
4,206,370 6/1980 Leach, Jr. ............................ 377/63

Primary Examiner—Gene Z. Rubinson
Assistant Examiner—Stephen Brinich
Attorney, Agent, or Firm—Joseph S. Tripoli; George E. Haas; Allen LeRoy Limberg

[57] ABSTRACT

Disclosed are CCD imagers, each with a composite image register comprising two component image registers with interleaved charge transfer channels is operated with charge transfer in opposite directions from the two image registers. Also disclosed are apparatuses for suppressing transfer smear from the output video signals supplied from such CCD imagers.

2 Claims, 9 Drawing Figures

CCD IMAGERS WITH INTERLEAVED IMAGE REGISTERS USING OPPOSED DIRECTIONS OF CHARGE TRANSFER

The present invention relates to charge-coupled-device (CCD) imagers.

BACKGROUND OF THE INVENTION

CCD imagers have been known in which charge transfer from all the charge transfer channels in an image register has been in one direction during alternate field scans and in the opposite direction during the intervening field scans. Y. Takemura in U.S. Pat. No. 3,777,061 issued Dec. 4, 1983 and entitled "Solid State Image Pickup Device" describes a field transfer type of CCD imager in which the entire content of the image register is alternatively transferred, either across a first line register (side-loading and side-unloading) to a first field storage register at one end ofthe image register, or to a second field storage register at the other end of the image register, between the image register and a second line register. The field of charge packets descriptive of image elements stored in the first field storage register is transferred a line at a time to the first line register during line retrace intervals in odd-numbered fields, side-loading the first line register with charge packets parallelly-in-time with each other; and the first line register is subsequently operated as a shift register to unload these charge packets from an end of the register serially-in-time during line trace intervals in the odd-numbered fields, for conversion to samples of video signal. The field of charge packets descriptive of image elements stored in the second field storage register is transferred a line at a time to side-load the second line register during line retrace intervals in even-numbered field; and the second line register is subsequently operated as a shift register to unload these charge packets from an end of the register serially-in-time during line trace intervals in the even-numbered fields, for conversion to samples of video signal.

A CCD imager may have its image register partitioned into halves with charge packets descriptive of elements in the top or left half of the image transferred out of the image register in a direction opposite to charge packets descriptive of elements in the bottom or right half of the image. U.S. patent application Ser. No. 562,528 filed Dec. 19, 1983 by H. Elabd and W. F. Kosonocky, entitled "Imagers with Registers Partitioned for Simultaneous Charge Transfers in Opposing Directions" and assigned to RCA Corporation describes such CCD imagers. Other such CCD imagers are described in U.S. patent application Ser. No. 590,888 filed Mar. 16, 1984 by H. Elabd and W. F. Kosonocky, entitled "High Resolution CCD Imagers ", and assigned to RCA Corporation.

U.S. patent application Ser. No. 646,103 entitled "Opposite-Direction Multiple-Phase Clocking in Adjacent CCD Shift Registers" filed by the present inventor Aug. 31, 1984 describes how every other one of a plurality of parallelled charge transfer channels may be clocked (i.e., alternate ones of the channels) so as to transfer charge in a direction opposite to charge transfer in the remainder of the charge transfer channels.

The transfer of charge from the image register of a CCD imager is carried out in this way in the present invention. This facilitates the solution of several long-standing problems encountered in CCD imager design and operation, particularly in CCD imagers in which photoconversion of a radiant energy image to charge packets sampling elements of the image takes place within the charge transfer channels of the image register themselves. A longstanding problem in CCD imagers, particularly of the field transfer type, is the phenomenon known as "transfer smear". U.S. Pat. No. 4,010,319 issued to P. A. Levine on Mar. 1, 1977, entitled "Smear Reduction in CCD Imagers", and incorporated herein by reference describes how this undesirable smear is generated. While the problem of transfer smear has been specifically solved for static images where high brightness areas do not recur in the same portions of line scan on separated scan lines, the problem has not herebefore been generally solved. Certain other aspects of the transfer smear problem have been solved, but the problem has remained intractable to general solution.

Another longstanding problem in CCD imagers of field transfer type is field shading owing to dark current integration. U.S. Pat. No. 4,496,982 issued Jan. 29 1985 to P. A. Levine, entitled "Compensation Against Field Shading in Video From Field-Transfer CCD Imagers", and assigned to RCA Corporation provides a primer with regard to this problem and is incorporated herein by reference.

In most CCD imagers a parallel-in/series-out CCD line register is used to convert groups of charge packets received parallelly-in-time for supplying those charge packets serially-in-time for subsequent conversion to a continuous video signal. The groups of charge packets parallel-in-time are supplied to the CCD line register from spatially adjacent and parallel charge transfer channels. The CCD line register is side-loaded under gate electrodes which must be interleaved amongst other gate electrodes. These other gate electrodes are needed to implement the normal CCD charge transfer processes in the shift register operation which takes place after side-loading and provides for putting the charge packets out serially-in-time. There are practical problems with obtaining enough space on the surface of the CCD substrate in which to fit these other electrodes, it being desirable to make the gate electrodes under which side-loading of charge packets takes place to have lengths long enough to span the respective widths of the charge transfer channels from which the charge packets are transferred during side-loading. The invention provides relief from the output-line-register gate-electrode-crowding problem.

SUMMARY OF THE INVENTION

The image register of a CCD imager embodying the present invention comprises two image registers with their respective charge transfer channels interleaved and arranged for opposite directions of charge transfer. Responses to the charge packets transferred out of the two interleaved image registers are combined to provide a video signal output.

BRIEF DESCRIPTION OF THE DRAWING

In FIGS. 1-5 the first layer of polysilicon is shown in stipple; the second layer, in lower left to upper right cross hatch; and the third layer, in upper left to lower right cross hatch. The lay-outs are shown viewed from the top surface of the underlying semiconductor substrate. In this specification the words "top", "bottom", "over", "under", etc., unless otherwise specified, are used in accordance with the conventional parlance of semiconductor design engineers and do not refer to actual orientations in space that differ from that in accordance with convention. Conventionally, the polysilicon layers are ordinally numbered in order of their successive disposition over the top surface of the semiconductor substrate, and this convention is followed in the detailed description following. The first polysilicon layer per conventional CCD construction is insulated from the substrate top surface; and each succeeding polysilicon layer is insulated from the preceding polysilicon layer, insulating being provided typically by silicon oxide or nitride layers grown from a gaseous phase. Cross sections through a charge transfer channel are, substantially at least, conventional and are not illustrated by figure.

DETAILED DESCRIPTION

Figure 1:
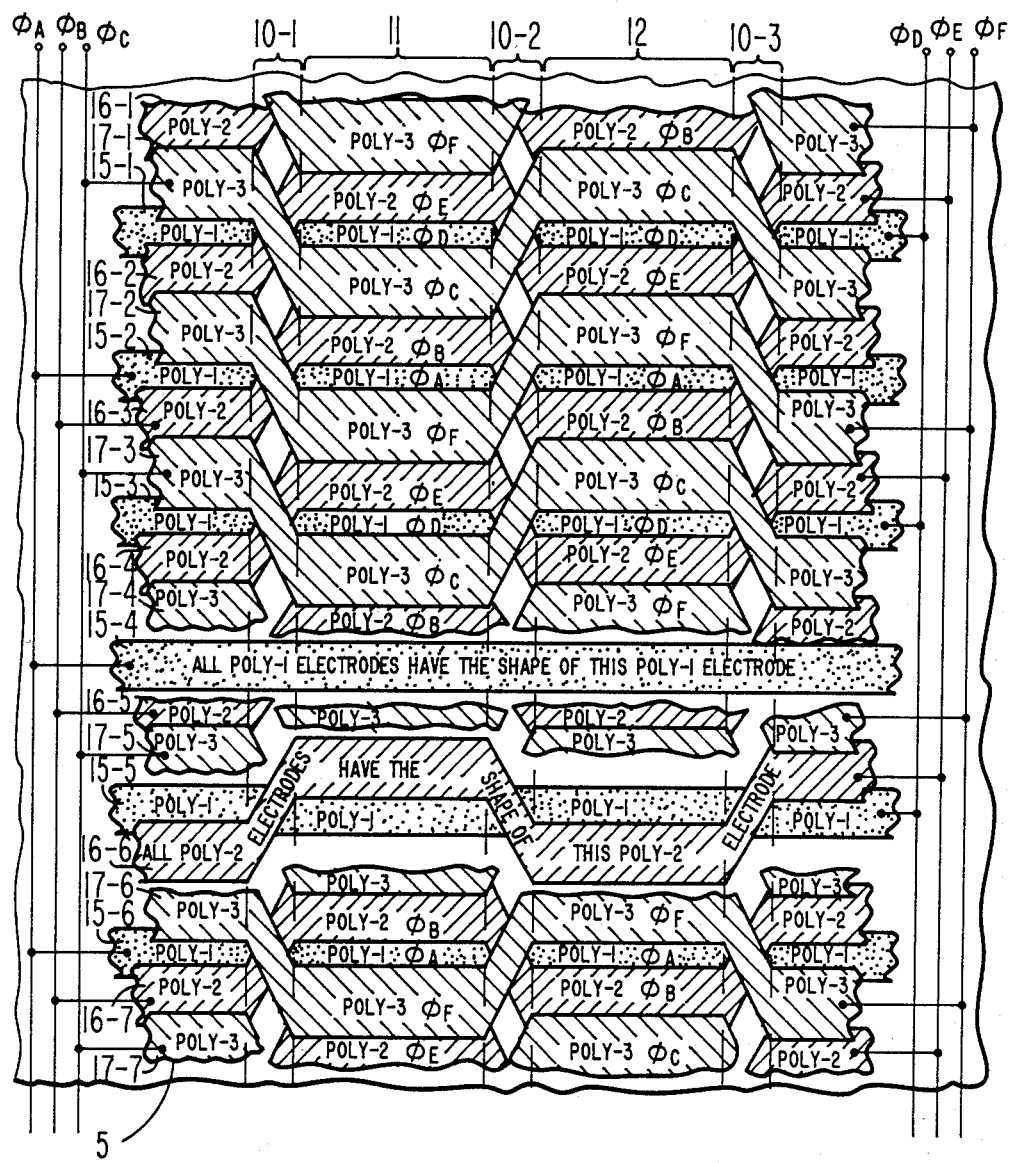
FIG. 1 is a lay-out of a gate electrode structure in three polysilicon layers, suitable for six-phase clocking of adjacent charge transfer channels, so as to transfer charge in opposite directions in these channels in accordance with a subcombination aspect of the invention.

Before commencing with a description of the CCD imager arrangements that are of primary concern with regard to the present invention, consideration must be given to arrangements for implementing the clocking of CCD shift registers in parallel alignment (as may be used to sense an image) so that charge packets may be advanced in opposite directions in adjacent shift registers.

Such an arrangement is known in the prior art for CCD shift registers clocked in two phases. In this prior art CCD circuitry pairs of first-polysilicon-layer and second-polysilicon-layer gate electrode structures cross adjacent charge transfer channels. The first-layer and second-layer gate electrode structures in each pair meander back and forth respective to each other to appear in opposite order in adjacent charge transfer channels, each cross-over/cross-under taking place over a channel stop between adjacent charge transfer channels. Both the gate electrodes in each pair are connected to receive the same phase of clocking signal, and each succeeding pair of gate electrodes receives the phase of two-phase clocking signal complementary to the phase received by the preceding pair. The second-polysilicon-layer gate electrodes have barrier implantations into the substrate beneath them to determine the directionality of charge transfer from the first-polysilicon-layer gate electrode towards the second-polysilicon-layer electrode for each pair of gate electrodes. Because of the cross-meandering of the pair of electrodes so they appear in opposite order in adjacent charge transfer channels, charge transfer is in opposing directions in adjacent charge transfer channels.

It is desirable to clock CCD shift registers in at least three phases, however, to obtain the best yields of usable devices during semiconductor device manufacturing. Short-throughs between overlapping polysilicon layers which render a two-phase CCD shift register useless can be tolerated in multiple-phase CCD shift registers. CCD shift registers with multiple-phase clocking also have greater dynamic range since the fraction of the charge transfer channel taken up by potential barriers is smaller respective to the fraction of the channel in which potential wells are available for holding charge.

Control of the directionality of charge transfer in CCD shift registers using multiple-phase clocking signals is not normally determined by barrier implantations, but rather by the order in which the gate electrodes having different phases of clocking appear across the charge transfer channel. Multiple-phase-clocked CCD shift registers can be clocked in opposite phase sequence to reverse the direction of charge transfer, which is not possible with two-phase-clocked CCD shift registers using implanted barriers. Conventionally, clocking phases are denominated by ordinal numbers indicative of their normal order of succession in time.

Gate electrodes which meander respective to each other along their widths can be used to re-order the appearance of clock phases to be different in adjoining charge transfer channels. A gate electrode can cross over one, or perhaps two, other gate electrodes in the area of the channel stop separating adjacent charge transfer channels. However, the number of layers of polysilicon available for gate electrode structures is usually limited to three to keep the number of manufacturing steps within reason. It is desirable that cross-overs and cross-unders can be kept in the same layer of polysilicon as the gate electrodes being connected, to avoid having to ohmically contact a top-metalization cross-over. Particularly in larger CCD imagers, the top metalization (which is usually aluminum deposited by evaporative or sputtering processes) is reserved for bussing to the underlying polysilicon gate electrodes of the CCD's and is not used for forming CCD gate electrodes. Frequent contacts from these busses to the gate electrodes are used to reduce the gate electrode resistance controlling the RC time constant encountered by the clocking signals applied to the gate electrodes.

In CCD imagers where image integration takes place in parallel CCD shift registers, it is conventionally preferred to arrange the gate electrodes such that the centers of picture elements ("pixels") integrated in adjacent charge transfer channels are aligned in straight lines normal to the charge transfer channels. This imposes another constraint on lay-out.

Multiple-phase clocking of parallelled shift registers adjacent ones of which have opposing directions of charge transfer therethrough is generally claimed in U.S. patent application Ser. No. 646,103, filed Aug. 31, 1984.

A portion 5 of parallelled CCD shift register apparatus is shown in FIG. 1. A set 10 of parallel channel stop structures 10-1, 10-2, 10-3 (running from top to bottom of FIG. 1) define a pair of adjacent charge transfer channels 11, 12 (also running from top to bottom of FIG. 1). In each of these charge transfer channels 11, 12 charge is to be transferred in a direction opposite to the direction of charge transfer in the other. (This pair of charge transfer channels 11, 12 may be viewed as representative of any two adjacent charge transfer channels in a large array of parallelled charge transfer channels.) Charge transfer channels 11, 12 can be clocked in six successive phases $\phi_1$, $\phi_2$, $\phi_3$, $\phi_4$, $\phi_5$, $\phi_6$, applied to the terminals labelled $\phi_A$, $\phi_B$, $\phi_C$, $\phi_D$, $\phi_E$, $\phi_F$, respectively. Alternatively, charge transfer channels 11, 12 can be clocked in three successive phases $\phi_1$, $\phi_2$, $\phi_3$, with $\phi_1$ being applied to the $\phi_A$ and $\phi_D$ terminals, with $\phi_2$ being applied to the $\phi_B$ and $\phi_E$ terminals, and with $\phi_3$ applied to the $\phi_C$ and $\phi_F$ terminals. The $\phi_A$, $\phi_B$, $\phi_C$, $\phi_D$, $\phi_E$, $\phi_F$, terminals are represented as being connected via top metalization to the gate electrodes in the various layers of polysilicon. However, in practice the gate electrodes receiving the same phase of clocking signal may be in a comb structure, with the gate electrodes forming the teeth of the comb structure. The spine, or back, of the comb is then ohmically contacted and connected by top-metalization and bond wires to the clocking signal connections.

Figure 2:
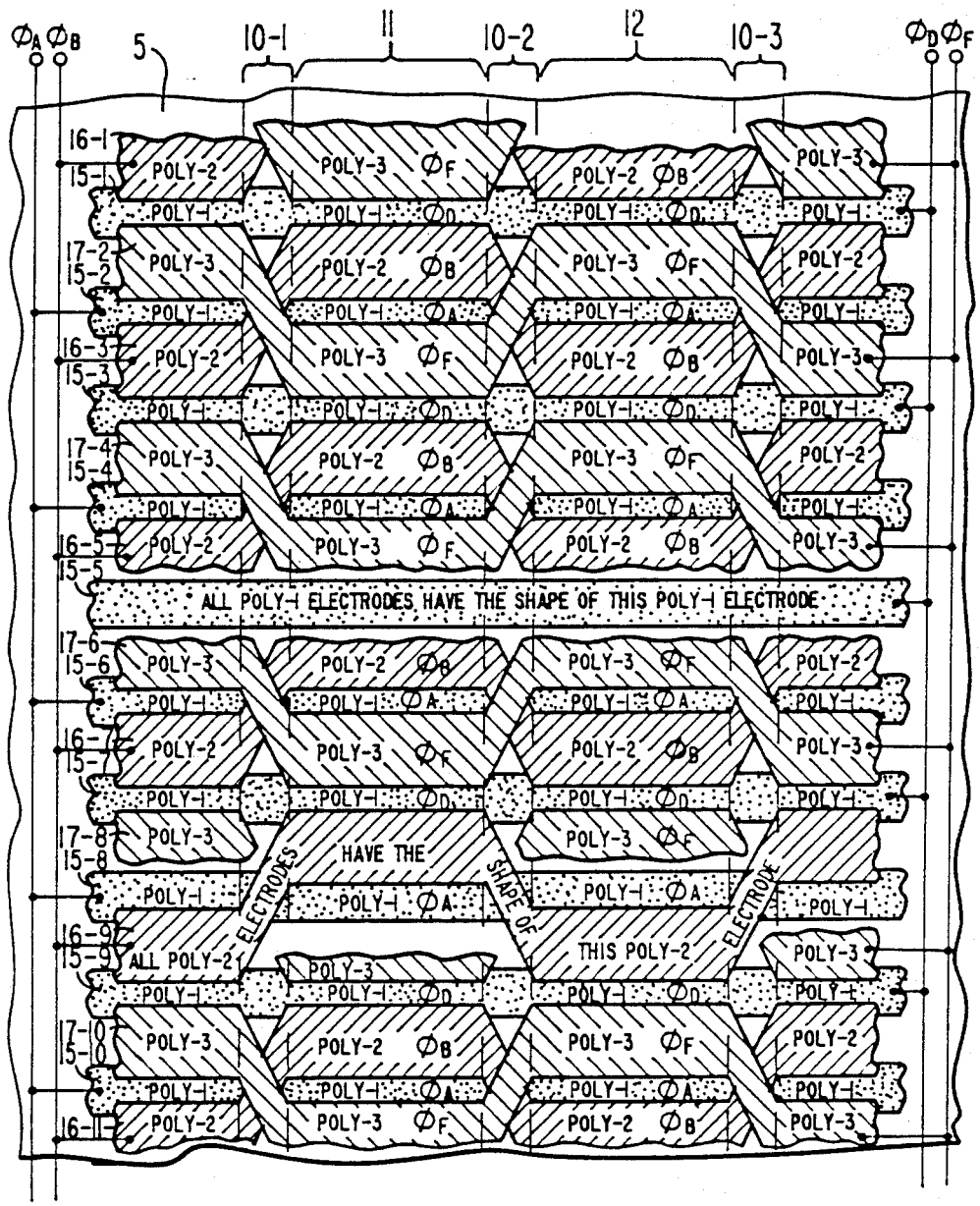
FIG. 2 is a lay-out of a gate electrode structure in three polysilicon layers, suitable for four-phase clocking of adjacent charge transfer channels, so as to transfer charge in opposite directions in these channels in accordance with a subcombination aspect of the invention.
Figure 3:
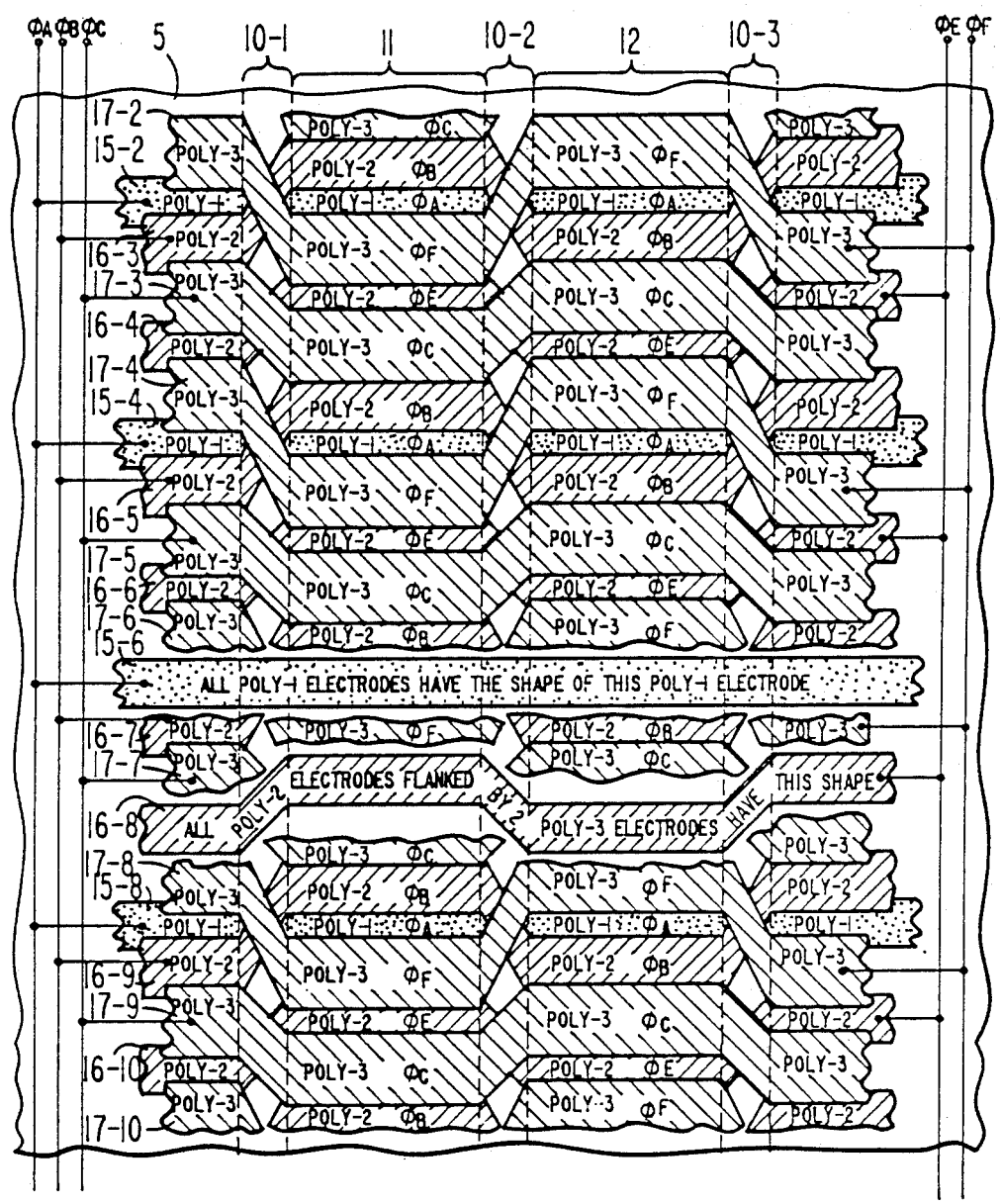
FIG. 3 is a lay-out of a gate electrode structure in three polysilicon layers suitable for five-phase clocking of adjacent charge transfer channels, so as to transfer charge in opposite directions in those channels, in accordance with a subcombination aspect of the invention.

A set 15 of gate electrodes, straight along their width, are formed in the first layer of polysilicon and cross the charge transfer channels 11, 12 at regular intervals. (The terms "length" and "width" respective to CCD gate electrodes are used in accordance with the convention amongst CCD engineers, that the length of the gate electrode is measured in the direction of charge transfer and its width in the direction normal to charge transfer. That is, the length of the gate electrodes in FIGS. 1, 2 and 3 is in the direction from top to bottom of figure; and the width, in the direction from left to right of figure.) The odd-suffix gate electrodes 15-1, 15-3, 15-5 of set 15 of first-layer-polysilicon gate electrodes connect to $\phi_D$ clock phase terminal; the even-suffix gate electrodes 15-2, 15-4, 15-6 of set 15 connect to $\phi_A$ clock phase terminal. The set 15 of gate electrodes in the first polysilicon layer shield the underlying semiconductor substrate from the electrostatic induction effects of the cross-overs in the overlying second and third polysilicon layers, which will be presently described. In preferred embodiments of the invention, then, the gate electrodes straight along their width will be in the first polysilicon layer. Portions of the second- and third-polysilicon-layer gate electrodes overlying the first-polysilicon-layer gate electrode 15-4 are cut away in FIG. 1 to reveal the shape of that representative first-polysilicon-layer gate electrode.

A set 16 of gate electrodes in the second polysilicon layer meander over channel stops 10-1, 10-2, 10-3 and across respective ones of the straight gate electrodes in the first polysilicon layer, to appear on opposite sides of them in adjacent ones of the plurality of charge transfer channels. The odd-suffix gate electrodes 16-1, 16-3, 16-5 of set 16 connect to $\phi_B$ clock phase terminal; the even-suffix gate electrodes 16-2, 16-4, 16-6 of set 16 connect to $\phi_E$ clock phase terminal. FIG. 1 has cut away in it the portions of third-polysilicon-layer gate electrodes overlapping the straight first-polysilicon-layer gate electrode 15-5 and the cross-meandering second-polysilicon-layer gate electrode 16-6, to make this relationship easier to perceive. In charge transfer channel 11 the second-polysilicon-layer gate electrode 16-6 is above the first-polysilicon-layer gate electrode 15-5, as depicted in FIG. 1, and is clocked with the next successive clock-phase. This is so of every straight first-polysilicon-layer gate electrode and cross-meandering second-polysilicon-layer gate electrode pair that crosses the charge transfer channel 11. So charge transfer tends to be upward in charge transfer channel 11 as depicted in FIG. 1.

In charge transfer channel 12 the second-polysilicon-layer gate electrode 16-6 is below the first-polysilicon-layer gate electrode in 15-5, as depicted in FIG. 1, but is clocked with the next successive clock-phase. This is so of every straight first-polysilicon-layer gate electrode and cross-meandering third-polysilicon-layer gate electrode pair that crosses the charge transfer channel 12. So charge transfer tends to be downward in charge transfer channel 12 as depicted in FIG. 1.

A set 17 of gate electrodes in the third polysilicon layer also meander over respective ones of the straight gate electrodes in the first polysilicon layer, but meander in phasing opposite to the second-polysilicon layer gate electrodes. The odd-suffix gate electrodes 17-1, 17-3, 17-5 of set 17 connect to $\phi_C$ clock phase terminal; the even suffix gate electrodes 17-2, 17-4, 17-6 of set 17 connect to $\phi_F$ clock phase terminal. So, in the charge transfer channel 11 each first-polysilicon-layer gate electrode is followed by respective second- and third-polysilicon-layer gate electrodes clocked with successively later clocking phases in the upward direction in FIG. 1, which causes charge transfer in channel 11 to be in that upward direction. In charge transfer channel 12 each first-polysilicon-layer gate electrode is followed by respective second- and third-polysilicon-layer gate electrodes clocked with successively later clocking phases in the downward direction in FIG. 1, with causes charge transfer in channel 12 to be in that downward direction.

FIG. 2 depicts the gate electrode arrangement to four-phase clock the adjacent CCD shift registers 11, 12 for opposite directions of charge transfer. The six-phase-clocking gate electrode structure of FIG. 1 is modified to omit the third-polysilicon-layer gate electrodes receptive of $\phi_C$ clock phase and to omit the second-layer-polysilicon-layer gate electrodes receptive of $\phi_E$ clock phase. The resulting gate electrode structure is compressed along the lengths of the charge transfer channels, to eliminate the spacings between successive gate electrodes and to overlap their edges appropriately. $\phi_A$, $\phi_B$, $\phi_D$ and $\phi_F$ connections are then arranged to receive the successive four phases $\phi_1$, $\phi_2$, $\phi_3$ and $\phi_4$ of clocking signal, to transfer charge upward in charge transfer channel 11 and downward in charge transfer channel 12.

FIG. 3 depicts the gate electrode arrangement to five-phase clock the adjacent CCD shift registers 11, 12 for opposite directions of charge transfer. The six-phase-clocking gate electrode structure of FIG. 1 is modified to omit the first-polysilicon-layer gate electrodes receptive of $\phi_D$ clock phase. The resulting gate electrode structure is compressed vertically along the lengths of the charge transfer channels, to eliminate the spacings between successive gate electrodes and to overlap their edges appropriately. $\phi_A$, $\phi_B$, $\phi_C$, $\phi_E$ and $\phi_F$ connections are then arranged to receive the successive five phases $\phi_1$, $\phi_2$, $\phi_3$, $\phi_4$ and $\phi_5$ of clocking signal, to transfer charge upward in charge transfer channel 11 and downward in charge transfer channel 12.

Figure 4:
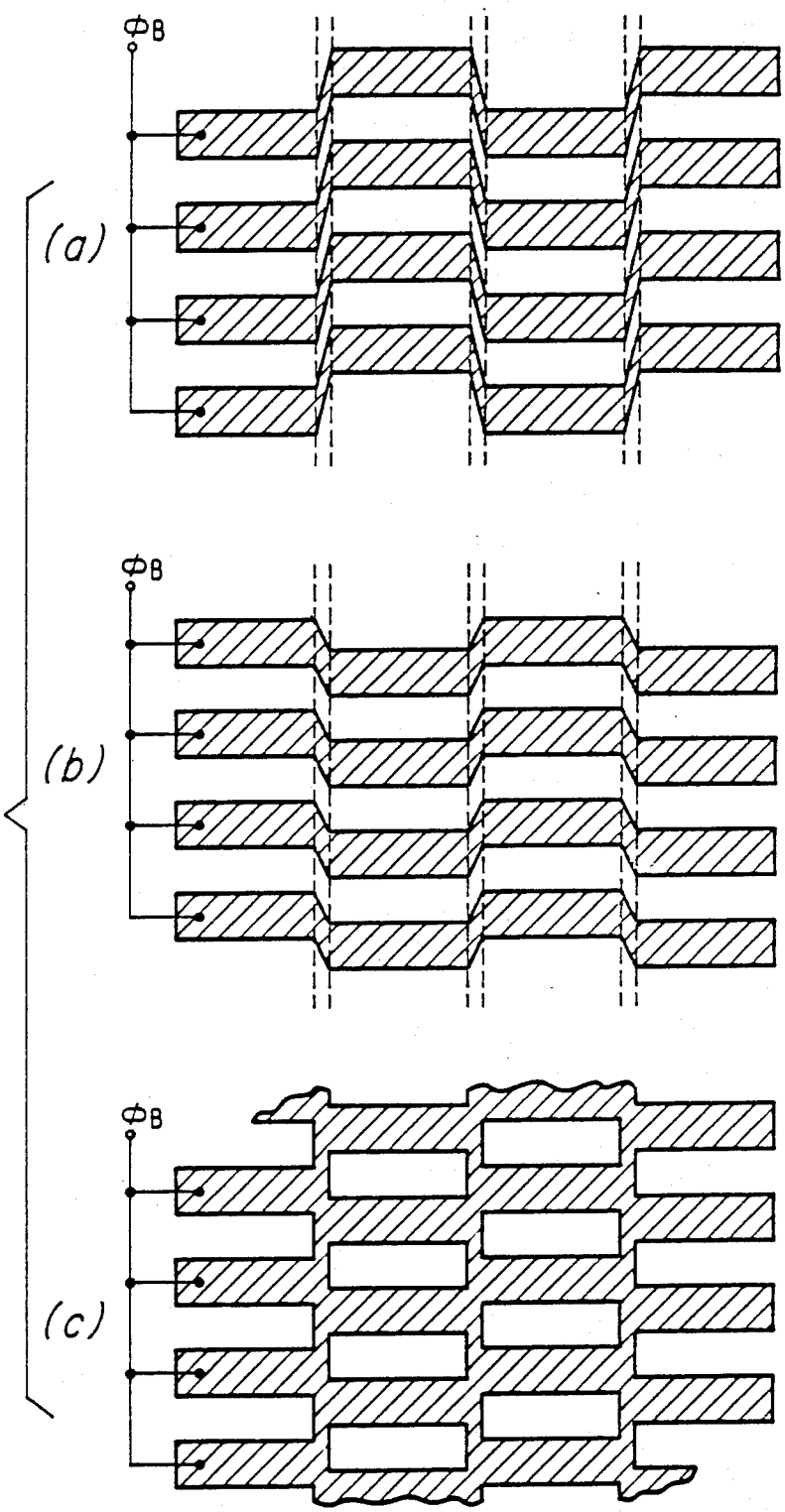
FIG. 4 and FIG. 5 depict modifications of lay-out that can be made to FIG. 1 structure, for example.
Figure 5:
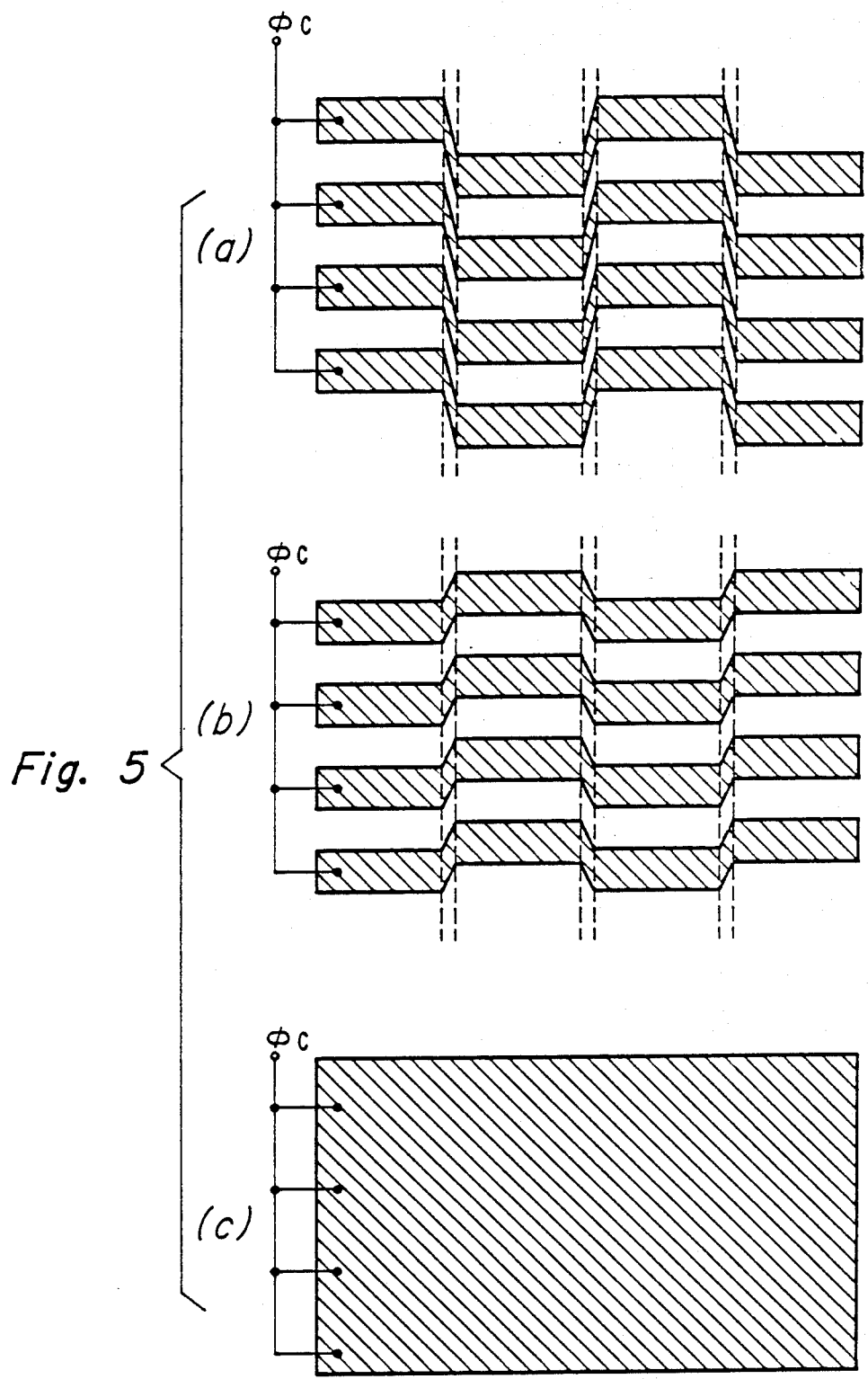

FIG. 4 in its a, b and c portions shows alternative second-polysilicon-layer gate electrode structures that can be used when apparatus similar to that of FIG. 1 is to be clocked three-phase. FIG. 5 in its a, b, and c portions shows alternative third-polysilicon-layer gate electrode structures that can be used when apparatus similar to that of FIG. 1 is to be clocked three-phase. Straightforward connection of $\phi_A$ and $\phi_D$ to receive $\phi_1$, connection of $\phi_B$ and $\phi_E$ to receive $\phi_2$, and connection of $\phi_C$ and $\phi_F$ to receive $\phi_3$ in FIG. 1 will result in having second- and third-layer-polysilicon gate electrode structures as shown in FIGS. 4a and 5a.

Modifying that parallelled CCD shift register arrangement to replace the second- and third-layer-polysilicon gate electrode structures of FIGS. 4a and 5a with those of FIGS. 4b and 5b is an advantageous way to provide for three-phase clocking. With this modification the second- and third-polysilicon-layer gate electrodes cross-meander only across each other and not across the first-polysilicon-layer gate electrodes. The "steepness" of the diagonal connections in the channel stop regions is less severe, and these connections thus widen to provide lower resistance along the width of the gate electrodes. This lowers the RC time constants associated with the gate electrodes and permits a higher clocking rate with less clocking power consumption.

FIG. 4c shows a second-polysilicon-layer gate electrode structure close to that resulting when both the types of cross-over in FIGS. 4a and 4b are used together. Its RC time constant tends to be somewhat lower than that of the FIG. 4a or 4b configuration. Inasmuch as the semiconductor substrate in which the charge transfer channels repose is shielded from the electrostatic induction of the third-polysilicon-layer electrodes by the first- and second-polysilicon-layer electrodes, the gate electrode structures of FIGS. 5a and 5b can be replaced by a simple sheet electrode per FIG. 5c. The variant gate electrode structures of FIGS. 4c and 5c may replace respective gate electrode structures of FIG. 2 in corresponding layers of polysilicon.

The principles concerning how to interleave parallel charge-coupled-device shift registers in which charge transfer direction is in a first direction and in a second direction, opposite to the first direction, have been disclosed. In a CCD imager it is useful to use a composite image register in which the charge transfer channels of a first component image register recurrently having charge transfer in a first direction are interleaved with the charge transfer channels of a second component imager recurrently having charge transfer in a first direction are interleaved with the charge transfer channels of a second component imager recurrently having charge transfer in a second direction opposite to the first. This will now be explained both for field transfer and line transfer types of CCD imager.

Figure 6:
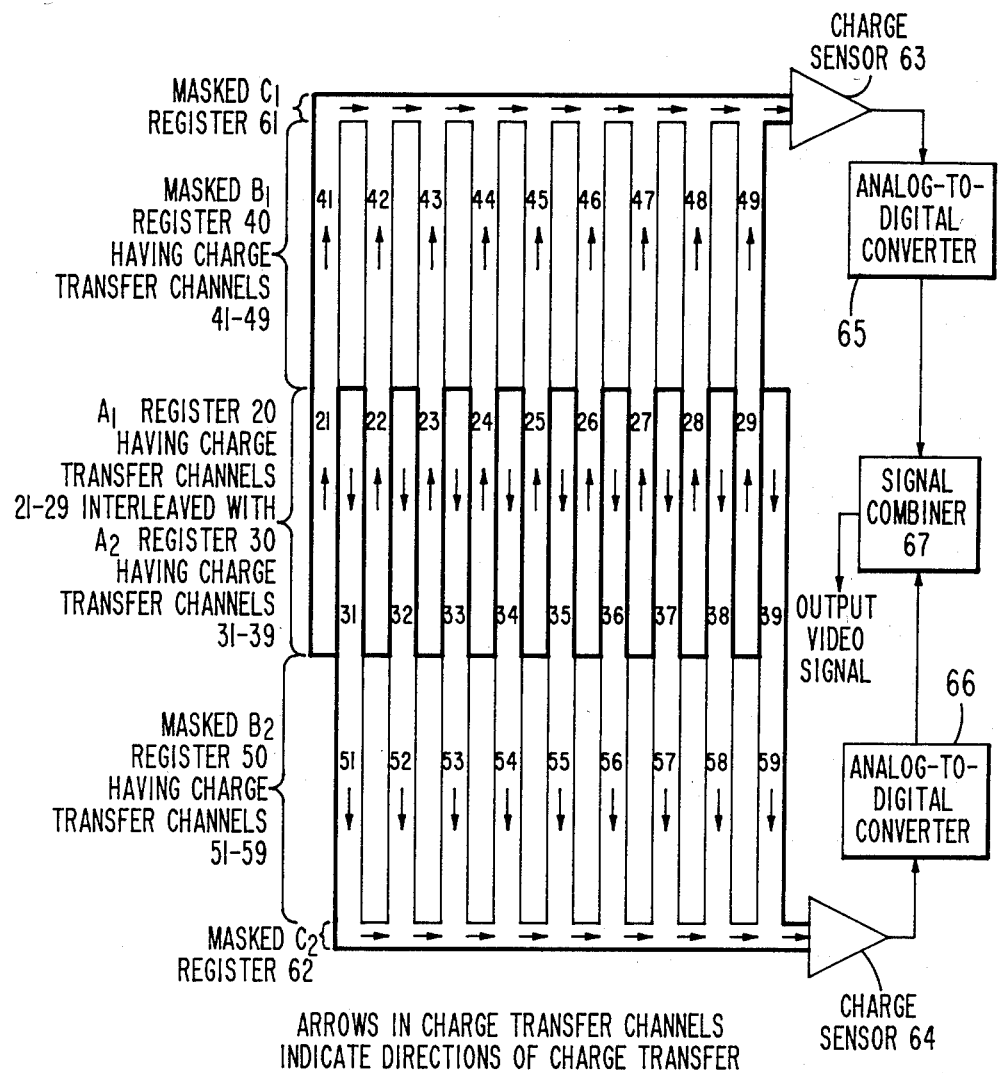
FIG. 6 is a block diagram of a field-transfer type of CCD imager contructed in accordance with the invention.

FIG. 6 shows a field transfer type of CCD imager having a composite image (or A) register comprising a first component image (or $A_1$) register 20 having charge transfer channels 21-29 and a second component image (or $A_2$) register 30 having charge transfer channels 31-39 alternated or interleaved with charge transfer channels 21-29 of $A_2$ register 20. Only nine charge transfer channels are shown in each of the $A_1$ register 20 and $A_2$ register 30 because of drafting constraints; in actual practice the interleaved component image registers will typically each have a few hundred columns. In accordance with a primary aspect of the invention, the charge transfer channels 21-29 in component image ($A_1$) register 20 are arranged charge transfer at selected times in a first direction, the first direction being upward in FIG. 6, as indicated by the arrows in the channels 21-29; and the charge transfer channels 31-39 in component image ($A_2$) register 30 are arranged for charge transfer at selected times in a second direction, opposite to the first direction, that second direction being downward in FIG. 6, as indicated by the arrows in the channels 31-39.

The charge transfer channels in a charge-coupled-device are normally defined by channel stops implanted in the semiconductor substrate. It is common practice to use anti-blooming drain structures over the channel stops defining the charge transfer channels of the image register in a CCD imager register. Serpentine connection of these blooming drains with the drains continuing across the channel-stopped ends of the image register charge transfer channels substantially reduces the number of top-metalization busses on the top of the CCD imager. In a large CCD imager operated at normal video scan rates it is a practical necessity to provide frequent top-metalization bus connections to the gate electrodes in each of the registers, so reduction of other top-metalization requirements is helpful to design. The large-amount of top-metalization (usually aluminum) interferes with the passage of illuminating radiation, so it is usually preferable to back-illuminate the CCD imager. That is, the surface of the semiconductor substrate opposite to the surface on which the gate electrodes are formed is eroded away to leave a thinned substrate; then, after suitable surface treatment of the newly exposed surface of the thinned substrate, this nearly exposed surface is the one on which illumination is allowed to impinge during the operation of the imager. The surface through which the CCD imager receives illumination is masked by an optically opaque mask. This mask is of a type allowing only the image register (comprising $A_1$ register 20 and $A_2$ register 30 in FIG. 6) to receive illumination, different types of mask being required depending on whether the imager is front-illuminated or back-illuminated.

Dynamic clocking of the $A_1$ register 20 and of the $A_2$ register 30 is suspended during image integration intervals. Charge carriers generated by photoconversion processes in the charge transfer channels 21-19 and 31-39 and in the semiconductor substrate underlying them are collected into charge packets in the potential energy wells induced by the static clocking voltages imposed on the gate electrodes of the $A_1$ register 20 and $A_2$ register 30. These image integration intervals, per convention, occur during the field trace intervals in the output video signal from the field transfer CCD imager.

These field trace intervals are separated from each other by field retrace intervals interleaved in time with them. Field transfer intervals occur during respective ones of the field retrace intervals in the output video signal. During a field transfer interval the dynamic clocking of $A_1$ register 20 and of $A_2$ register 30 is restored.

The charge packets transferred from the output connections of the charge transfer channels 21-29 in $A_1$ image register 20, for storage in a portion 40 of the field storage (or B) register termed the "$B_1$ register", are applied to corresponding input connections of charge transfer channels 41-49 in that $B_1$ register 40. $B_1$ register is clocked synchronously with $A_1$ register during field transfer so the charge packets applied to its input connection continue to tranfer upwards into charge transfer channels 41-49. The charge packets from $A_1$ register 20 after upward transferal repose in charge tranfer channels 41-49 at the beginning of field trace. The charge packets transferred from the output connections of the charge transfer channels 31-39 in $A_2$ register 30 are similarly transferred downward into the charge transfer channels 51-59 of a portion of the B register termed the "$B_2$ register".

During the ensuing image integration interval when dynamic clocking of the $A_1$ register 20 and $A_2$ register 30 is again suspended, charge packets in the $B_1$ register 40 and $B_2$ register 50 are clocked forward a line at a time during line retrace intervals. Lines of charge packets transfer upward in $B_1$ register 40, with the line of charge packets clocked from the output connections of charge transfer channels 41-49 side-loading into respective charge transfer stages of a first line (or $C_1$) register $C_1$ 61 during the line retrace interval. Lines of charge in $B_2$ register 50, on the other hand, transfer downward, with the line of charge packets clocked from the output connections of charge transfer channels 51-59 side-loading into respective charge transfer stages of a second line (or $C_2$) register 62 during the line retrace interval. Dynamic clocking of line registers 61, 62 is suspended during their side-loading in the line retrace interval. During line trace, dynamic clocking of line registers 61, 62 resumes to shift the lines of charge packets in these line registers 61, 62 by shift register action to appear in serial format at their respective output end connections. The output end connection of $C_1$ register 61 supplies charge packets serially to the input connection of a first charge sensor 62, and the output end connection of $C_2$ register 62 supplies charge packets serially to the input connection of a second charge sensor 64. The output signals from charge sensors 63 and 64 are digitized in analog-to-digital converters 65 and 66 before being combined in a signal combiner 67 to generate an output video signal.

Figure 7:
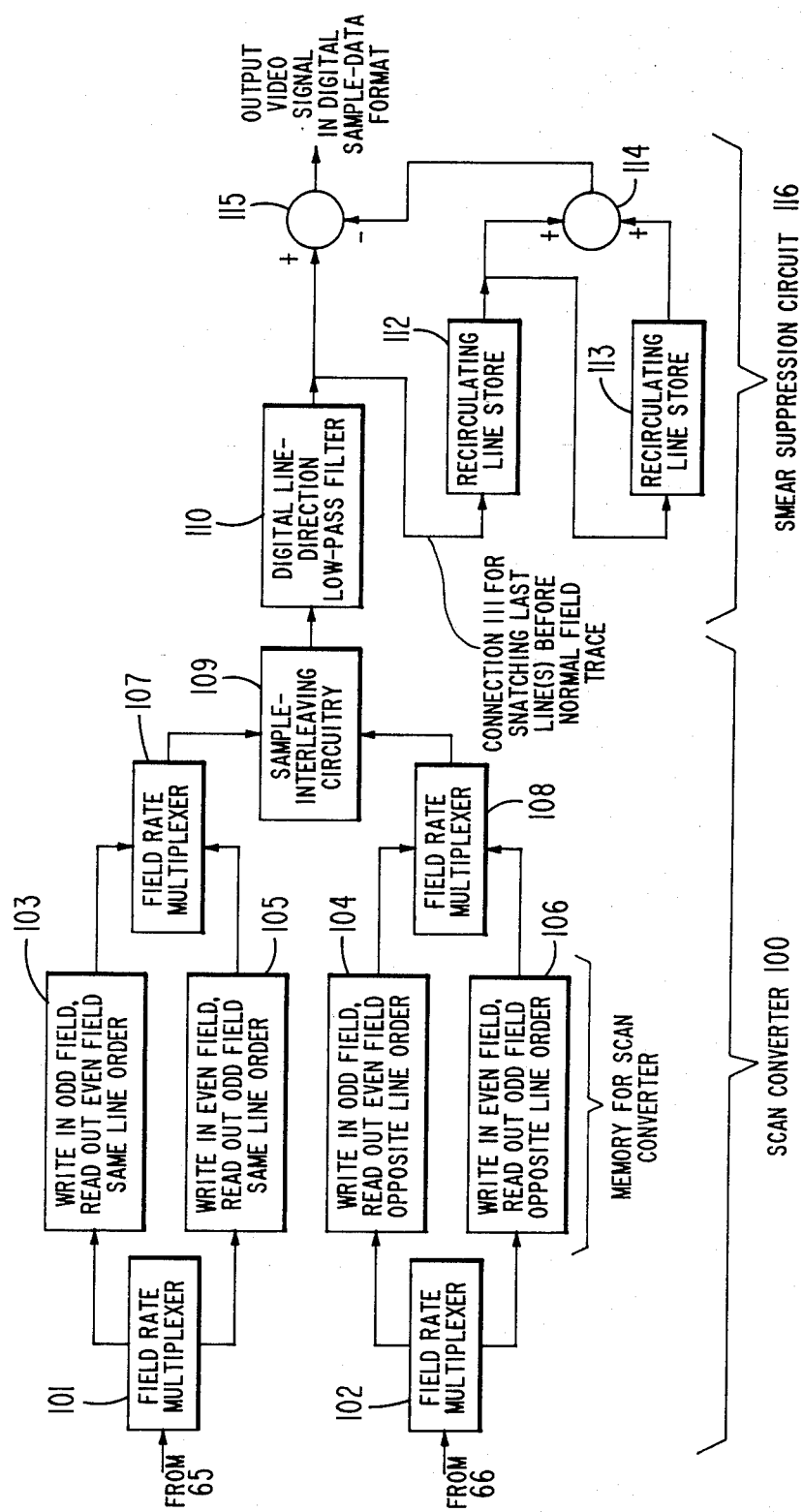
FIG. 7 is a block diagram of a signal combiner used with the FIG. 6 CCD imager to provide scan conversion attendant to combining signals and to suppress dark-current field shading and transfer smear, in accordance with the invention.

FIG. 7 shows a form the signal combiner 67 in FIG. 6 may take. The $B_1$ register 40 of FIG. 6 is read out line by line from its bottom to its top, which makes the order of line scan for the inverted image projected into the $A_1$ register 20 and the $A_2$ register come out correctly for conventional top-to-bottom scan of a television image. The $B_2$ register 50 of FIG. 6, on the other hand, is read out line by line from its top to its bottom, making the order lines are read out from it opposite to the order lines are read out of $B_1$ register 40. Scan conversion of the $B_2$ register 50 output signal to reverse line scan order therein is a necessary preliminary step if one is to combine the respective output signals of $B_1$ register 40 and of $B_2$ register 50.

Scan converter 100 includes a multiplexer 101 for selectively applying the output signal from analog-to-digital converter 65, to write a first portion 103 of its memory during odd-numbered field trace times, or to write a second portion 105 of its memory during even-numbered field trace times. Scan converter 100 also includes a multiplexor 102 for selectively applying the output signal from analog-to-digital converter 66, to write a third portion 104 of its memory during odd-numbered field trace times, or to write a fourth portion 106 of its memory during even-numbered field trace times. Scan converter 100 includes a multiplexer 107 for selectively taking read-out, from the first portion 103 of its memory during even-numbered field trace times, or from the second portion 105 of its memory during odd-numbered field trace times. Scan converter 100 also includes a multiplexer 108 for selectively taking read-out, from the third portion 104 of its memory during even-numbered field trace times, or from the fourth portion 106 of its memory during odd-numbered field trace times. The portions 103 and 105 of scan converter 100 memory are read out in the same line order as written in, and the portions 104 and 106 of the memory are read out in opposite line order as written in. So the samples supplied at the output connections of multiplexers 107 and 108 will be alternate picture-element (pixel) samples of the same line of video signals. Circuitry 109 in scan converter 100 interleaves the samples in time.

The output samples from scan converter 100 are supplied to the input connection of a digital filter 110, which is low-pass in the direction of line scan. Filter 100 will cause some loss in image resolution in the direction of line scan, so preferably the cut-off frequency of the filter is chosen only so low as to cut off the aliasing terms caused by the repetitive pattern of the parallel arrangement of the charge transfer channels of the composite image (or A) register. The spatial frequency response in phasing close to the spatial phasing of these parallelled charge transfer channel extends further than the spatial frequency response in the intermediate phasing. Undesirable Moire' aliasing terms originate when portions of an image, having spatial frequency content similar to the frequency of charge transfer channel spacing, move respective to the pattern of charge transfer channels in the image (or A register). The simplest filter with desired cut-off characteristics is one in which each current sample is added to the sample preceding it.

The staircase field shading in alternate horizontal phases (columns) of image samples arising from dark current accumulation in the $B_1$ register 40 and in the $B_2$ register 50, respectively, exhibit opposite slopes. The opposite-slope field shadings add to a constant black-level shift in the low-pass-filter 110 output signal, higher frequency variation being higher than filter 110 cut-off frequency. This black-level shift is relatively unnoticable compared to field shading, so there is little need for compensating against it. Whether or not the small black level shift is compensated against, the need for the fairly complex circuitry to compensate against the line-by-line staircase increase of integrated dark current in output video signal is eliminated by the low-pass filter 110.

Transfer smear in adjacent columns of image samples like dark current shading, tend to be complementary in character. However, the combined transfer smear response is only constant in the direction parallel to these columns, perpendicular to these columns there is modulation dependent on the average smear content of each successive column of image samples. This introduces striations perpendicular to line scan responsive to bright regions in the image. However, the fact that transfer smear response tends to be constant in a column of image samples, from the first scan line to the last, greatly simplifies the problem of transfer smear compensation.

The $A_1$ register 20 and $A_2$ register 30 of FIG. 6 may continue to be clocked for a time after all the charge packets corresponding to image samples have been completely transferred out of them to $B_1$ register 40 and to $B_2$ register 60, respectively. The phantom lines of charge clocked through $A_1$ register 20 and $A_2$ register 30 are transferred into extra rows of $B_1$ register 40 and $B_2$ register 50 as lines of charge packets formed primarily in response to smear. The accumulation of a line of smear charge samples by continuing to clock an image register after it is cleared of image samples, is known in general principle from U.S. patent application Ser. No. 554,085 filed 21 Nov. 1983 by P. A. Levine, entitled "Smear Reduction in CCD Imagers Using Empty Well Clocking," and assigned to RCA Corporation. The sets of samples descriptive of a line of smear charge samples are transferred from the $B_1$ register 40 and $B_2$ register 50 via $C_1$ register 61 and $C_2$ register 62, respectively to be written into one pair of scan converter 100 memory portions (103, 104 during odd-numbered fields or 105, 106 during even-numbered fields). The normal line scan order when reading out from memory portions 103, 104 during even-numbered fields and when reading out from memory portions 105, 106 during odd-numbered fields is preceded by a reading out of the last scan line of smear samples. That is, the line of smear samples is read out of scan converter 100 memory through pixel interleaving circuitry 109 before normal field trace begins. The low-pass filter 110 response to these samples is snatched via connection 111 as the input signal for a line store 112. Line store 112 content is then recirculated during every scan line of the succeeding field trace. The averaged smear in this line of samples is the same as the first of the two components of averaged smear accompany video signal samples supplied from low-pass filter 110 during field trace, the component of averaged smear attributable to the most recent field transfer. The second component of averaged smear is the remnant smear left in the $A_1$ register 20 and $A_2$ register 30 following the preceding field transfer and removed from those registers during the most recent field transfer. This second component of averaged smear equals the first component of averaged smear in the preceding field of samples. To provide this component the line stored in line store 112 can be transferred during field retrace to a further line store 113. The line of smear samples stored in line store 113 is read out during every scan line in field trace and recirculated to read out the next line. The two lines of smear component samples from line stores 112 and 113 are added in an adder 114. Their sum is then subtracted in a subtractor 115 from filter 110 output signal to supply an output video signal in digital sample-data format, which signal is free of smear components. Low-pass filter 110, line stores 112 and 113, adder 114 and subtractor 115 together, then, constitute a smear suppression circuit 116.

The suppression of transfer smear artifacts as described above is substantially total suppression, even for the following conditions, which could not be satisfactorily suppressed with prior art smear suppression circuitry. Smear occurring when a column of pixels passes through a plurality of bright regions in the image field is more completely suppressed. Smear occurring when the imager is panned across the image field in a direction normal to the directions of charge transfer in the image register in more completely suppressed.

The primary transfer smear problem that remains is that occurring when a bright object does not overlap both of two adjacent columns in the imager, but only one. The transfer smear components in the two columns will not be complementary and so will not cancel in the procedures just described. So transfer smear artifacts may appear extending upward or downward over a two-column width at the leading or trailing edge of a bright object in a television image reconstructed from the FIG. 6 type of CCD imager. Such artifacts are more easily suppressed by spatial filtering techniques than are transfer smear of width corresponding to the number of imager columns spanned by a bright object, however.

Figure 8:
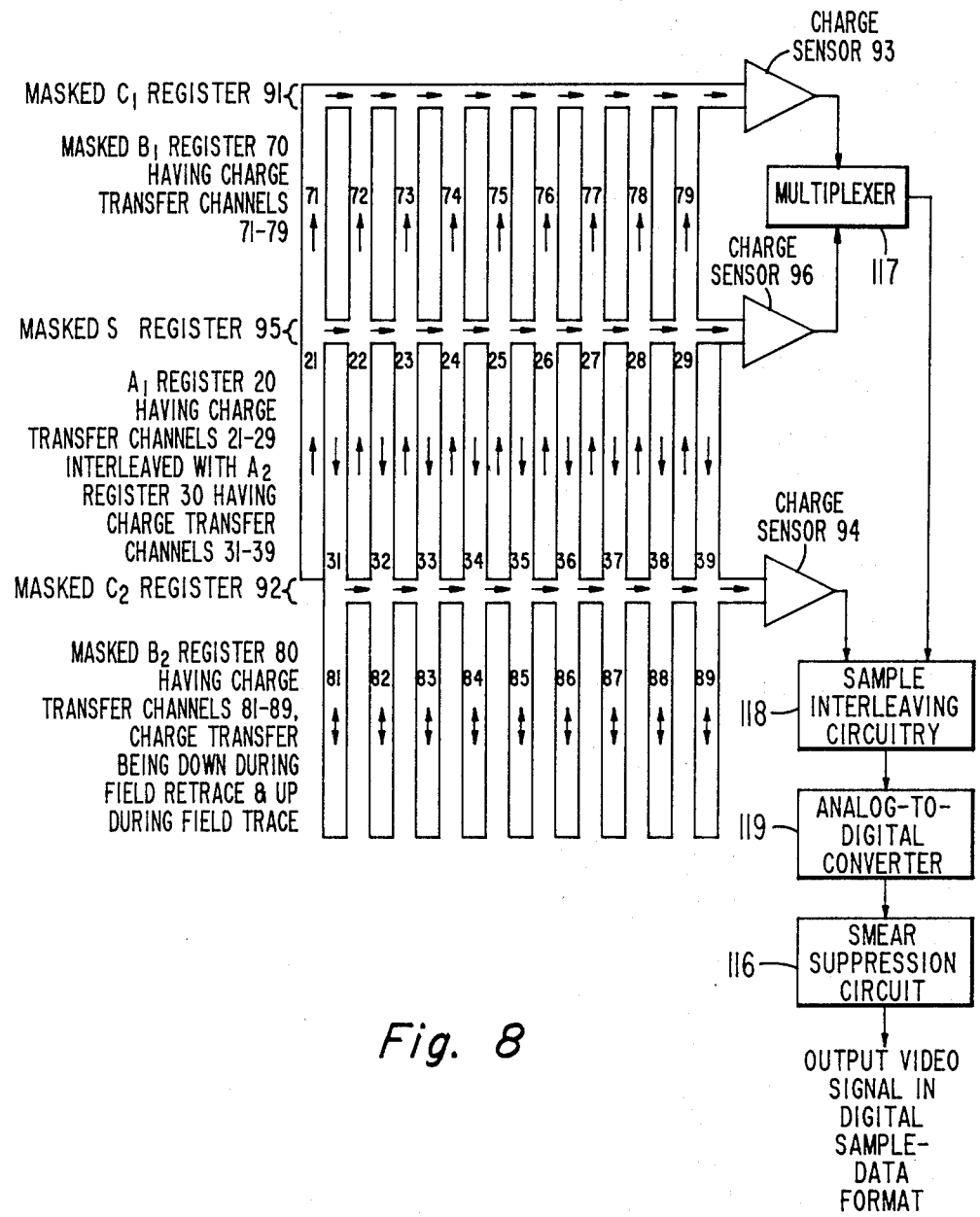
FIG. 8 is a block diagram of a field-transfer type of CCD imager constructed in accordance with the invention, which has an architecture substantially eliminating the need for scan conversion and the memory used therein.

FIG. 8 shows an alternative architecture for a field transfer type of CCD imager, which eliminates the need for most of the FIG. 7 scan converter 100, particularly the two fields of memory. During the field transfer in the field retrace interval, $A_1$ register 20 transfers lines of charge packets descriptive of image samples, in one side and out the opposite side of a masked line register 95, into the parallel charge transfer channels 71–79 of a masked $B_1$ register 70. During this transfer the clocking of the line register 95 as a shift register is discontinued, and the $A_1$ register 20 and $B_1$ register 70 are clocked synchronously at a relatively high rate to transfer lines of charge packets upward into $B_1$ register 70. Similarly, during field transfer, $A_2$ register 30 transfers lines of charge packets descriptive of image samples, in one side and out the opposite side of a masked line register 92, into the parallel charge transfer channels 81–89 of a masked $B_2$ register 80. During this transfer the clocking of the line register 92 as a shift register is discontinued, and the $A_2$ register 30 and $B_2$ register 80 are clocked synchronously at high rate to transfer lines of charge packets downward into $B_2$ register 80.

At the end of the field transfer before the resumption of the normal line scan in field trace, smear samples will repose in line register 92 and in line register 95. Line register 95, denominated the "smear" or "S" register, is used only for temporarily storing smear signals and converting them from parallel-in-time to serial-in-time format by shift register operation during read-out. Line register 92 is used for similar purpose, but also is used as the $C_2$ register during field trace. The charge packets in line registers 92 and 95 which are descriptive of smear samples are transferred by shift register action to a charge sensor 96 and a charge sensor 94, respectively. A multiplexer 117 selects the output signal from charge sensor 96 as its output signal, which is applied together with the output signal from charge sensor 94 as input signals to sample interleaving circuitry 118. The interleaved-in-time samples supplied as output from interleaving circuitry 118 are digitized in an analog-to-digital converter 119 to provide the digitized input signal supplied to smear suppression circuitry 116. Smear suppression circuitry 116 supplies output video signal in digital format and comprises a digital horizontal low-pass filter 110, a line snatching connection 111, a recirculating line stores 112 and 113, an adder 114 and a subtractor 115 per FIG. 7. The combined smear samples from line registers 92 and 95 repose in the recirculating line store at the beginning of field trace, then, to be subtracted out from output video plus average smear for providing output video signal in digitized format from smear suppression circuitry 116, which output video signal is free from transfer smear artifacts.

During the field trace interval, when normal line scan resumes, operation is as follows. The $A_1$ register 20 and $A_2$ register 30 have dynamic clocking suspended, so image samples may be accumulated from the charge carriers generated by photoconversion. The $B_1$ register 71 and the $B_2$ register are each clocked to transfer lines of charge packets upwards advancing a line at a time during line retrace. One line of charge packets is transferred out of $B_1$ register 70 each line retrace, to side-load a line register 91 used as the $C_1$ register; and one line of charge packets is transferred out of the $B_2$ register 80 each line retrace, to side-load line register 92 functioning as $C_2$ register. Then during line trace the forward clocking of $C_1$ register 91 and of $C_2$ register 92, halted during line retrace, is resumed. Samples are clocked forward at pixel scan rate in shift register operation of registers 91 and 92 to supply input samples serial-in-time to charge sensors 93 and 94 respectively. Multiplexer 117 selects the output signal samples of charge sensor 93 to be forwarded together with output signal samples of charge sensor 94 as input signals to sample interleaving circuitry 118.

The FIG. 8 architecture does not suppress dark current field shading, but the dark current field shading can be suppressed using the techniques described by P. A. Levine in U.S. Pat. No. 4,496,982.

Figure 9:
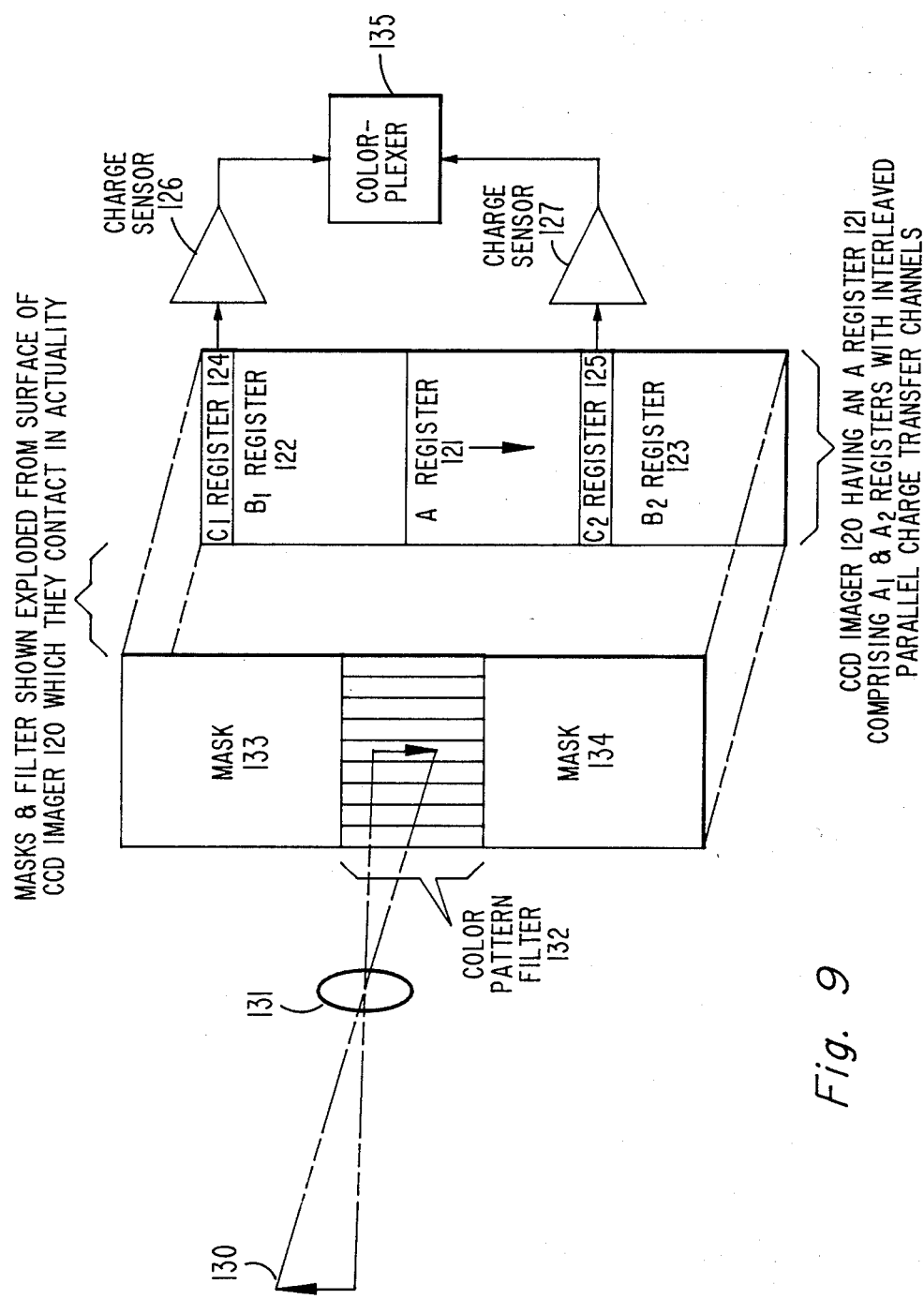
FIG. 9 is a block diagram showing the usefulness of a field-transfer CCD imager constructed in accordance with the invention when color pattern filtering is used to provide color discrimination in the imager response.

FIG. 9 illustrates how one may advantageously obtain color-discrimination video signal response from a field-transfer CCD imager 120 having an A register 121 comprising $A_1$ and $A_2$ registers with interleaved parallel charge transfer channels. A scene to be televised, represented by an element 130 of the scene, emits or reflects light which is collected by the optics 131 of the television camera and selectively transmitted through a color-pattern optical filter 132 to form an image on A register 121. The color pattern filter 132 is a subtractive filter and has color stripes or other columnar filter patterns which repeat in regular pattern. The columns in the filter pattern are in optical registration with respective ones of the charge transfer channels in the A register 121. Of particular interest are optical filter patterns in which the columnar pattern repeats every two columns. In such case, photoelectric response to one type of column filter optical response will appear exclusively in the $A_1$ register; and photoelectric response to the other type of column filter optical response will appear exclusively in the $A_2$ register.

CCD imager 120 has (in addition to its A register 120 comprising $A_1$ and $A_2$ registers with interleaved charge transfer channels) a $B_1$ register 122 and a $B_2$ register 123 which together provide a complete field storage (or B) register. CCD imager 120 also has a $C_1$ register 124 and a $C_2$ register 125 followed by respective charge sensors 126 and 127. An optically opaque mask 133 protects $B_1$ register 122 and $C_1$ register 124 from illumination, and an optically opaque mask 134 protects $B_2$ register 123 and $C_2$ register 125 from illumination. Masks 133 and 134 and color filter 132 are shown exploded from the illuminated surface of imager 120, which in actuality they contact. (A projection type of color-pattern filter and appropriate relay optics may alternatively be used instead of a contract type of color filter, of course). In operation A register 121 of CCD imager 120 substantially corresponds to the combined $A_1$ register 20 and $A_2$ register 30 of the FIG. 6 CCD imager; and elements 122, 123, 124, 125, 126 and 127 of CCD imager 120 substantially correspond to elements 70, 80, 91, 92, 93 and 94, respectively, of the FIG. 6 CCD imager.

The video samples supplied from charge sensor 126 will respond to image filtered by one set of the alternate columns in the color pattern filter 132, and the video samples supplied from charge sensor 127 will respond to image filtered by the other set of alternate columns in the color pattern filter 132. There is accordingly no need to de-multiplex the two sets of samples to initially separate them from each other, as was the case with prior-art CCD imagers, prior to their being combined in a composite video signal by a colorplexer 135.

One skilled in the art of CCD camera design and acquainted with the foregoing disclosure will be enabled to readily make a number of other embodiments of the invention. For example, the line stores 112 and 113 of FIG. 7 may have as respective input signals lines of smear samples snatched before a respective set of alternate field trace intervals. Scan converter 100 of FIG. 7 can be simplified to replace elements 101, 103, 105, 107 with a single field store of read-then-write type; and similarly the scan converter 150 of FIG. 10 can be simplified to replace elements 151, 153, 155, 157 with a single field store of read-then-write type. The wide range of possible embodiments of the invention should be kept in mind when construing the following claims, so as not to excessively narrow their scope.

I claim:

1. A CCD imager having:

first and second charge-coupled-device image registers each comprising a respective plurality of charge transfer channels and having their respective charge transfer channels spatially interleaved to receive a radiant energy image, each of said charge transfer channels having a respective output connection;

means for recurrently transferring charge packets in parallel through the charge transfer channels of said first image register in a first direction to the respective output connections of its charge transfer channels;

means for recurrently transferring charge packets in parallel through the charge transfer channels of said second image register in a second direction opposite the first direction to the respective output connections of its charge transfer channels; and means responding to the charge packets transferred from the output connections of the charge transfer channels in said first image register and in said second image register for generating a video output signal.

2. A CCD imager as set forth in claim 1 of field transfer type wherein said means for generating a video output signal comprises:

a first storage register having a plurality of parallelled charge-coupled-device charge transfer channels, with respective input connections from the output connections of the charge transfer channels in said first image register, and with respective output connections;

a second storage register having a plurality of parallelled charge-coupled-device charge transfer channels, with respective input connections from the output connections of the charge transfer channels in said second image connections of the charge transfer channels in said second image register, and with respective output connections;

a first charge-coupled-device shift register having a plurality of successive charge transfer stages connected to receive charge packets transferred from respective output connections of the charge transfer channels in said first storage register;

a second charge-coupled-device shift register having a plurality of successive charge transfer stages connected to receive charge packets transferred from respective output connections of the charge transfer channels in said second storage register; and means responding to charge packets shifted out of said first and second charge-coupled-device shift registers for generating said video output signal.

* * * * *